(12) United States Patent
Torvi et al.

(10) Patent No.: US 8,127,263 B2
(45) Date of Patent: Feb. 28, 2012

(54) IMPROVING ROUTABILITY OF INTEGRATED CIRCUIT DESIGN WITHOUT IMPACTING THE DESIGN AREA

(75) Inventors: Pavan Vithal Torvi, Bangalore (IN); Girishankar Gurumurthy, Chennai (IN); Dharin N Shah, Kundalahalli (IN); Ajith Harihara Subramonia, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 387 days.

(21) Appl. No.: 12/364,649

(22) Filed: Feb. 3, 2009

(65) Prior Publication Data

US 2010/0199252 A1 Aug. 5, 2010

(51) Int. Cl.
*G06F 17/50* (2006.01)

(52) U.S. Cl. ........ 716/126; 716/118; 716/119; 716/122; 716/129; 716/130

(58) Field of Classification Search .................. 716/118, 716/119, 122, 126, 129, 130
See application file for complete search history.

(56) References Cited

U.S. PATENT DOCUMENTS

| 5,311,443 | A  | * | 5/1994  | Crain et al. | 716/122 |
|-----------|----|---|---------|--------------|---------|
| 5,784,289 | A  | * | 7/1998  | Wang | 716/122 |
| 6,519,745 | B1 | * | 2/2003  | Srinivas et al. | 716/115 |
| 6,598,206 | B2 | * | 7/2003  | Darden et al. | 716/120 |
| 7,603,641 | B2 | * | 10/2009 | Lin | 716/120 |
| 2006/0080630 | A1 | * | 4/2006 | Lin | 716/11 |

* cited by examiner

*Primary Examiner* — Sun Lin
(74) *Attorney, Agent, or Firm* — John R. Pessetto; W. James Brady; Frederick J. Telecky, Jr.

(57) ABSTRACT

Improving routability of an integrated circuit (IC) design without impacting the area is described. A local region of congestion of an IC design is determined according to a design parameter. A cell with a specified level of complexity is identified within the local region of congestion. An alternative cell is algorithmically created with a same logic function as the cell by adding an access point to the alternative cell. The cell is then replaced with the alternative cell within the local region of congestion.

20 Claims, 7 Drawing Sheets

IMPROVING ROUTABILITY OF INTEGRATED CIRCUIT DESIGN WITHOUT IMPACTING THE DESIGN AREA

FIELD OF TECHNOLOGY

This disclosure relates generally to integrated circuits and more particularly to integrated circuit design.

BACKGROUND

A goal of integrated circuit (IC) design has been a reduction in the area of the IC. In order to achieve this goal, a designer can use a shorter height cell architecture to reduce the scale of the constituent components of the IC. At the time, the designer will often prefer to utilize high-pin density Boolean cells in order to increase the functionality of a component. Additionally, another goal of IC design has been to achieve a higher integration of devices within the integrated circuit. These three developments: the reduction in area of the IC, the high-pin density Boolean cells, and the higher integration of devices, have often lead to congestion and routability problems in an IC design layout. Increased congestion and routability problems in turn increase in the number of design rule violations, thereby jeopardizing the functionality of the resulting physical IC.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

Several methods and a system to improve the routability of an IC design without impacting the area are disclosed.

An exemplary embodiment provides a method of designing an IC. A local region of congestion of an IC design according to a design parameter is determined. A cell with a specified level of complexity is identified within the local region of congestion. An alternative cell is algorithmically created with a same logic function as the cell by adding an access point to the alternative cell. Further, the cell is replaced with the alternative cell within the local region of congestion.

An exemplary embodiment provides a system for designing an IC. The system includes a router module to determine a local region of congestion of the IC design according to a design parameter. The system also includes a cell module to identify a cell with a specified level of complexity in the local region of congestion. In addition, the system includes a template module to algorithmically create an alternative cell with an additional access point more than the cell and with a same logic function as the cell. Further, the system includes a placement module to replace the cell with the alternative cell within the local region of congestion.

An exemplary embodiment provides a method of designing an IC using software. A congested area of a layout of the IC is determined. An alternative template of a component of the IC is created. Further, a dimension of the alternative template is increased. A connecting pin is added to the alternative template. A template is replaced with the alternative template within the congested area of the layout of the IC.

The methods and systems disclosed herein may be implemented in any means for achieving various aspects, and may be executed in a form of a machine-readable medium embodying a set of instructions that, when executed by a machine, cause the machine to perform any of the operations disclosed herein. Other features will be apparent from the accompanying Drawings and from the Detailed Description that follows.

BRIEF DESCRIPTION OF THE VIEWS OF DRAWINGS

Example embodiments are illustrated by way of example and not limitation in the figures of the accompanying drawings, in which like references indicate similar elements and in which.

Other features of the present embodiments will be apparent from the accompanying Drawings and from the Detailed Description that follows.

DETAILED DESCRIPTION

Several methods and a system to improve the routability of an IC design without impacting the area are disclosed. Although the embodiments have been described with reference to specific example embodiments, it will be evident that various modifications and changes may be made to these embodiments without departing from the broader spirit and scope of the various embodiments.

Figure 1:
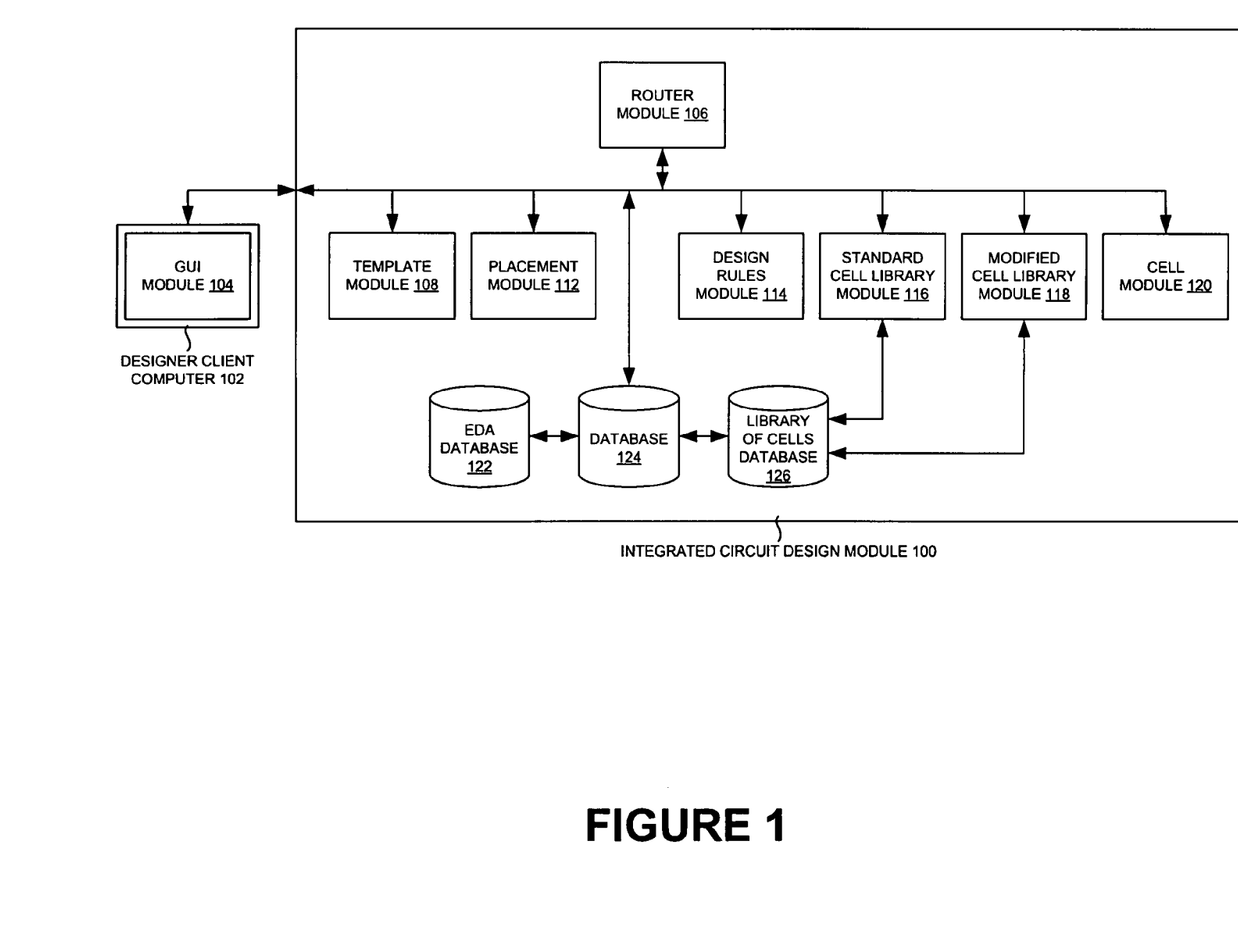
FIG. 1 is a system view of an IC design module, according to one embodiment.

FIG. 1 is a system view of an IC design module 100, according to one embodiment. Particularly, FIG. 1 illustrates an IC design module 100, a designer client computer 102, and a graphical user interface (GUI) module 104 in the designer client computer 102. The IC design module 100 may include a router module 106, a template module 108, a placement module 112, a design rules module 114, a standard cell library module 116, a modified cell library module 118, a cell module 120, an EDA database 122, a database 124, and a library of cells database 126, according to one embodiment.

The designer client computer 102 may be a general purpose computer with an arithmetic and logic unit (ALU), a control unit, a memory, and various input and output (I/O) devices including the GUI module 104. The designer client computer 102 may enable a designer to utilize the IC design module 100.

The GUI module 104 may be any type of human-computer interface. For example, the GUI module 104 may include a display screen offering visual indicators to a human user that allow the human user to interact with the electronic devices and computer logic of the designer client computer 102 and the IC design module 100.

The IC design module 100 may be coupled to the designer client computer 102. In other embodiments, the IC design module 100 may be integrated within the designer client computer 102 or associated with the designer client computer 102 via a network. The IC design module 100 may include a set of software applications facilitating IC design. The IC design module 100 may also include a set of hardware devices that physically implement the IC design software applications.

The design rules module 114 may implement a design rule checking (DRC) operation on the IC layout. The DRC operation may determine whether a particular IC layout satisfies a series of recommended parameters. These parameters may be a set of design rules that specify certain geometric and connectivity restrictions that ensure sufficient margins to account for variability in the process of manufacturing the IC. The DRC operation may verify the correctness of a mask set that defines the geometry for the photolithography steps of a semiconductor fabrication operation. The design rules may be specific to a particular semiconductor manufacturing process. For example, the design rules may include specified parameters to the width and spacing of particular components of the IC. The design rules module 114 may employ a specified DRC software application to conduct design rule checking.

The router module 106 may determine a region of local congestion of an IC design according to a specified number of possible design rule violations in a region of the IC layout. The router module 106 may include a software application to connect the placed IC components while obeying the design rules. The IC layout may be a representation of the IC in terms of planar geometric shapes which correspond to the patterns of metal, oxide, or semiconductor layers that make up the components of the IC. A local region of congestion 212 may be an area of the IC layout with a specified number of possible design rule violations. The possible design rule violations 208 may be caused by a limited number of routability options. The limited number of routability options may arise from a limited number of access points 210 on the input/output pins of a complex Boolean cell. Thus, increasing the number of access points 210 of the cell may alleviate the local congestion by offering a router more options to connect the I/O pin to a net. The router module 106 may include a router to algorithmically connect the components of the IC layout. The net may be a connecting wire of the IC. An access point 210 may be a location on the input/output pins of a cell. For example, a net may be a signal connect line or a power supply line. The router module 106 may determine the local region of congestion 212 after placement of the components of the IC. The router module 106 may determine the local region of congestion 212 after a first-pass routing operation. The router module 106 may determine the local region of congestion 212 after a global routing operation. The router module 106 may determine the local region of congestion 212 after a final routing operation. The router module 106 may determine a local region of congestion 212 according to any other design parameter.

The standard cell library module 116 may be coupled with a library of cells database 126. A cell may be an abstract representation of a component within a schematic diagram or a layout of an electronic circuit in software. A type of cell may have a low level logic function such as AND, OR, INVERT, flip-flops, latches and buffers. Another type of cell may have a high level Boolean logic function. The modified cell library module 118 may update the library of cells database 126 to include a modified version of a cell.

The database 124 may store a structured collection of data that is related to the IC design module 100. The database 124 may be coupled with an EDA database 122 and a library of cells database 126. The EDA database 122 may store a structured collection of data that is related to electronic design automation. For example, the EDA database 122 may store the data related to the design rules.

The cell module 120 may identify a cell with a specified level of complexity in the local region of congestion 212. The cell may be a complex Boolean cell. A complex Boolean cell may be a cell that performs a logical operation with at least one logic input and creates a single logic output according to a specified Boolean operation. The cell module 120 may include a software application to analyze a cell's Boolean logical view. The logical view may be captured in the form of a truth table or Boolean algebra equation (for combinational logic), or a state transition table (for sequential logic).

The template module 108 may algorithmically create an alternative cell with a same logic function as the cell identified by the cell module 120. The template module 108 may algorithmically increase the number of access points 210 on the I/O pins of the alternative cell. The template module 108 may algorithmically increase the area of the cells geometric representation with the IC layout.

The placement module 112 may replace the cell with the alternative cell within the region of congestion 212. The placement module 112 may position the alternative cell within the local region of congestion 212 according to the design parameter.

Figure 2:
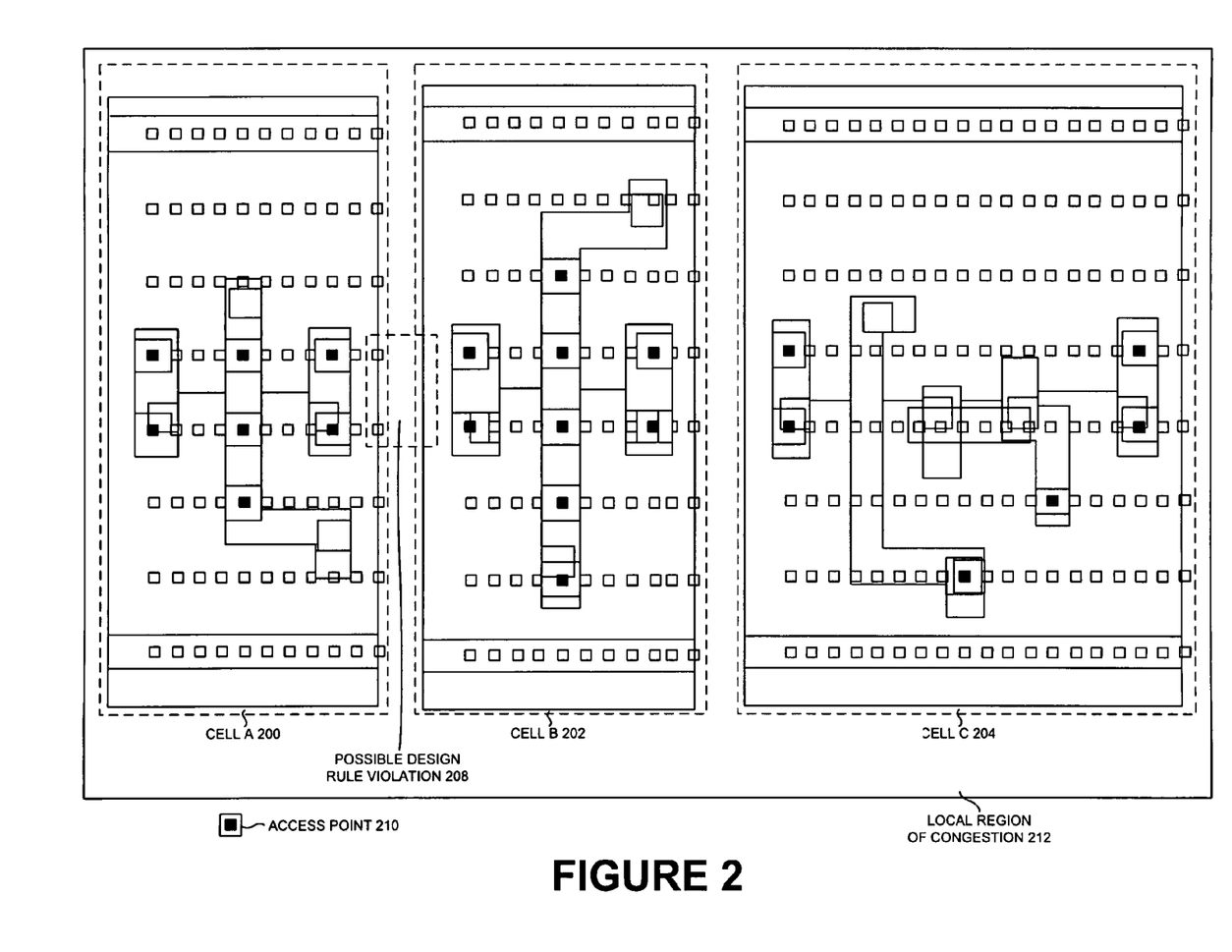
FIG. 2 is a schematic view that illustrates the design rules module identifying a possible design rule violation, according to one embodiment.

FIG. 2 is a schematic view that illustrates a step in a process of improving the routability of the local region of congestion 212 by increasing a number of access points 210 on the I/O pins of selected cells, according to one embodiment. Specifically, FIG. 2 illustrates the design rules module 114 identifying a possible design rule violation 208. The router module 106 may analyze a specified set of data in order to identify the local region of congestion 212. The specified set of data may include the possible design rule violation 208 and the type of cells associated with the possible design rule violation 208. The router module 106 may then determine a local region of congestion 212. The cell module 120 may identify cell A 200 and cell B 202 as having a specified level of Boolean complexity. The cell module 120 may not identify cell C 204 as having a sufficient specified level of Boolean complexity.

Figure 3:
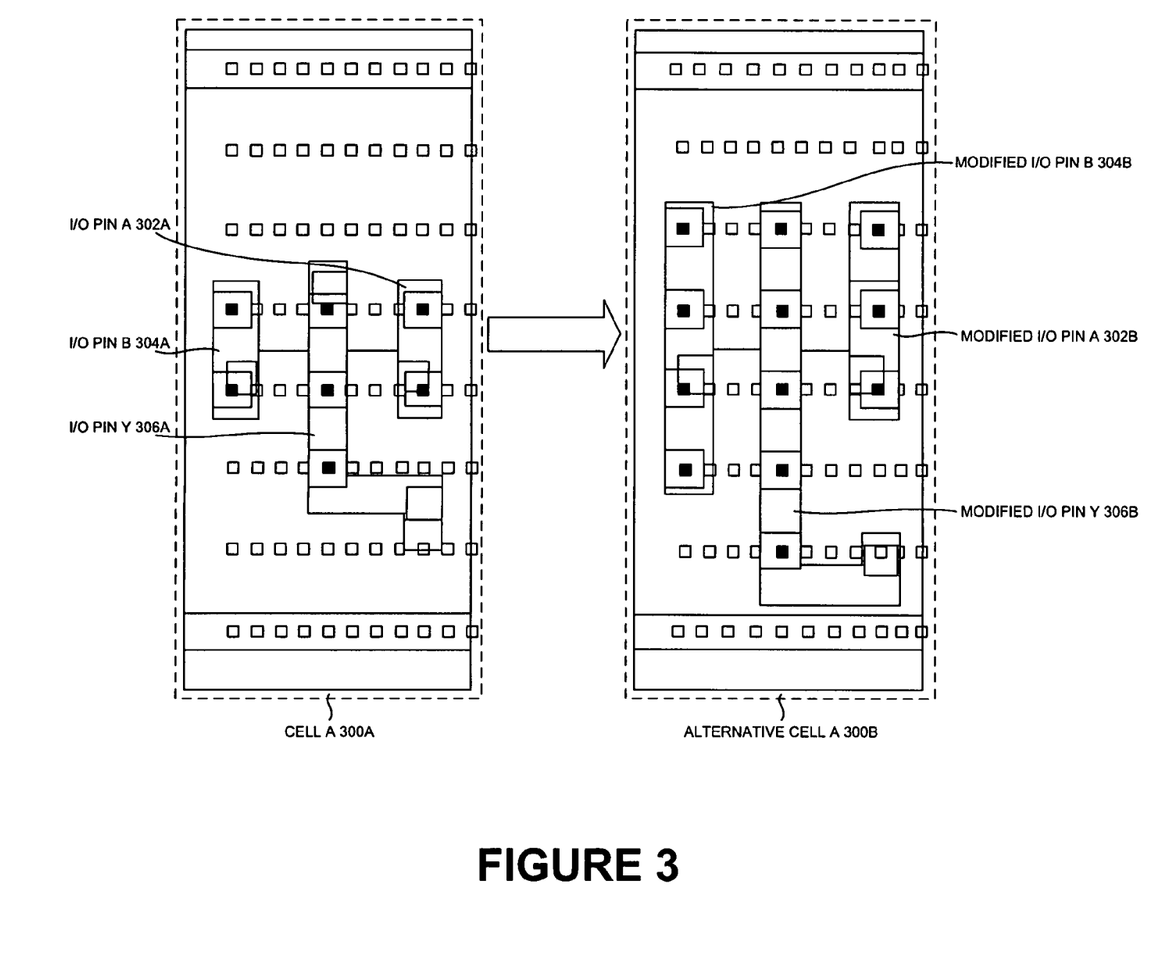
FIG. 3 is a schematic view that illustrates the template module increasing the number of access points for the I/O pins of a cell, according to one embodiment.

FIG. 3 is a schematic view that illustrates improving the routability of a local region of congestion 212 by increasing a number of access points 210 on the I/O pins of selected cells, according to one embodiment. Specifically, FIG. 3 illustrates the template module 108 increasing the number of access points 210 for the I/O pins of cell A 300A. The template module 108 increases the number of access points 210 for I/O pin A 302A from two to three to create a new modified pin A 302B. The template module 108 increases the number of access points 210 for I/O pin B 304A is increased from two to four to create a new modified pin B 304B. A manual operation may also increase the number of access points 210 in an I/O pin. The template module 108 increases the number of access points 210 for I/O pin Y 306A from three to five to create a new modified pin Y 306B. In the present embodiment, the layout area of the alternative cell A 300B is not greater than cell A 300A. However, in other embodiments, the area of cell A 300B may be increased to accommodate additional access points 210 on the I/O pins.

Figure 4:
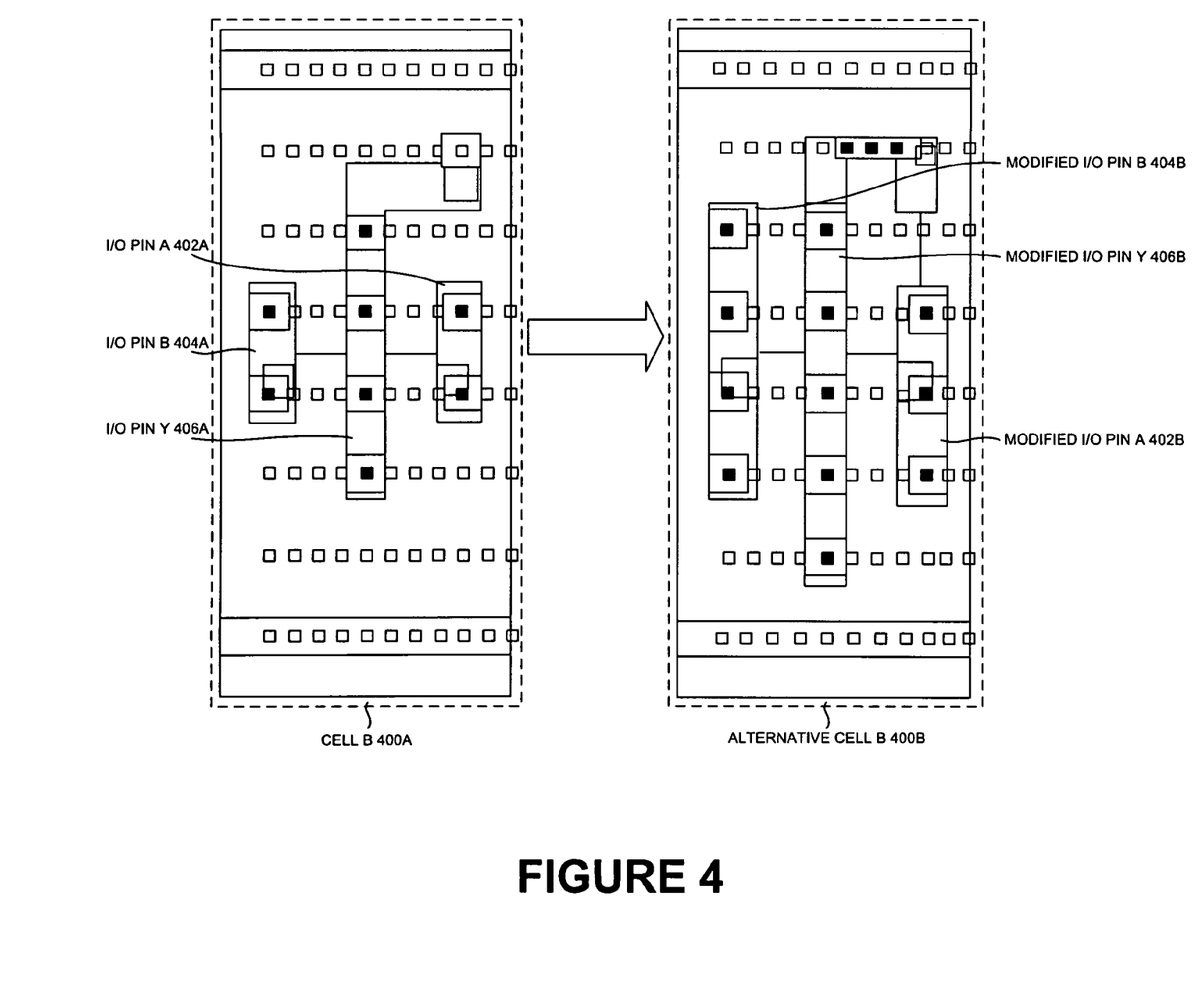
FIG. 4 is a schematic view that illustrates the template module increasing the number of access points for the I/O pins of another cell, according to one embodiment.

FIG. 4 is a schematic view that illustrates improving the routability of a local region of congestion 212 by increasing a number of access points 210 on the I/O pins of selected cells, according to one embodiment. Specifically, FIG. 4 illustrates the template module 108 increasing the number of access points 210 for the I/O pins of cell B 400A. The template module 108 increases the number of access points 210 for I/O pin A 402A from two to three to create a new modified pin A 402B. The template module 108 increases the number of access points 210 for I/O pin B 404A from two to four to create a new modified pin B 404B. The template module 108 increases the number of access points 210 for I/O pin Y 406A from four to six to create a new modified pin Y 406B. In the present embodiment, the layout area of the alternative cell A 400B is not greater than cell A 400A. However, in other embodiments, the area of cell A 400B may be increased to accommodate additional access points 210 on the I/O pins.

Figure 5:
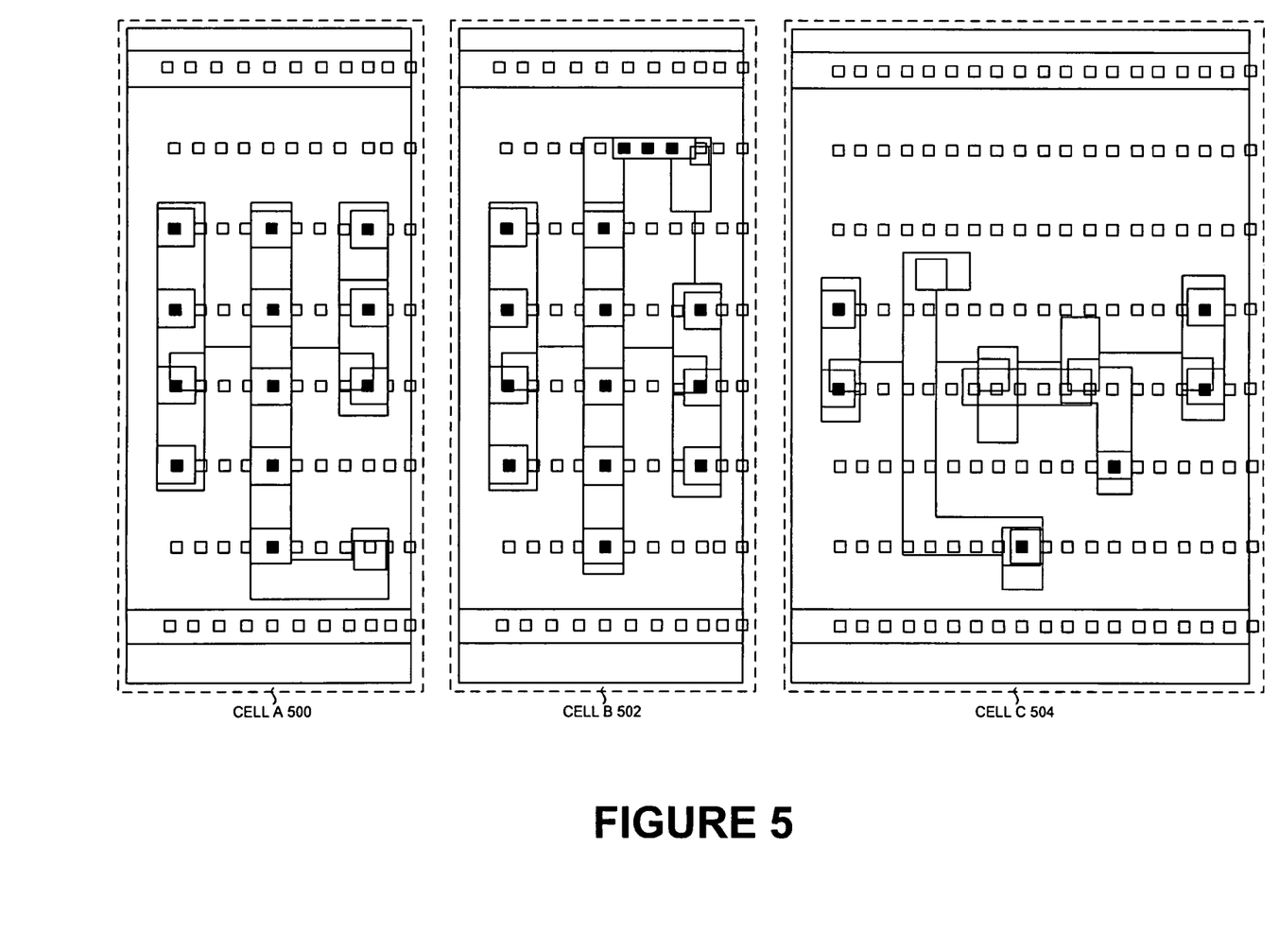
FIG. 5 is a schematic view that illustrates replacing several cells with alternative cells, according to one embodiment.

FIG. 5 is a schematic view that illustrates improving the routability of a local region of congestion 212 by increasing a number of access points 210 on the I/O pins of selected cells, according to one embodiment. Specifically, FIG. 5 illustrates the placement module 112 replacing cell A 200 with modified cell A 500. The placement module 112 may also replace the cell B 202 with modified cell B 502. The resulting local region may include an increased number of access points 210 on the I/O pins of the cells. The increased number of access points 210 may alleviate congestion within the local region.

Figure 6:
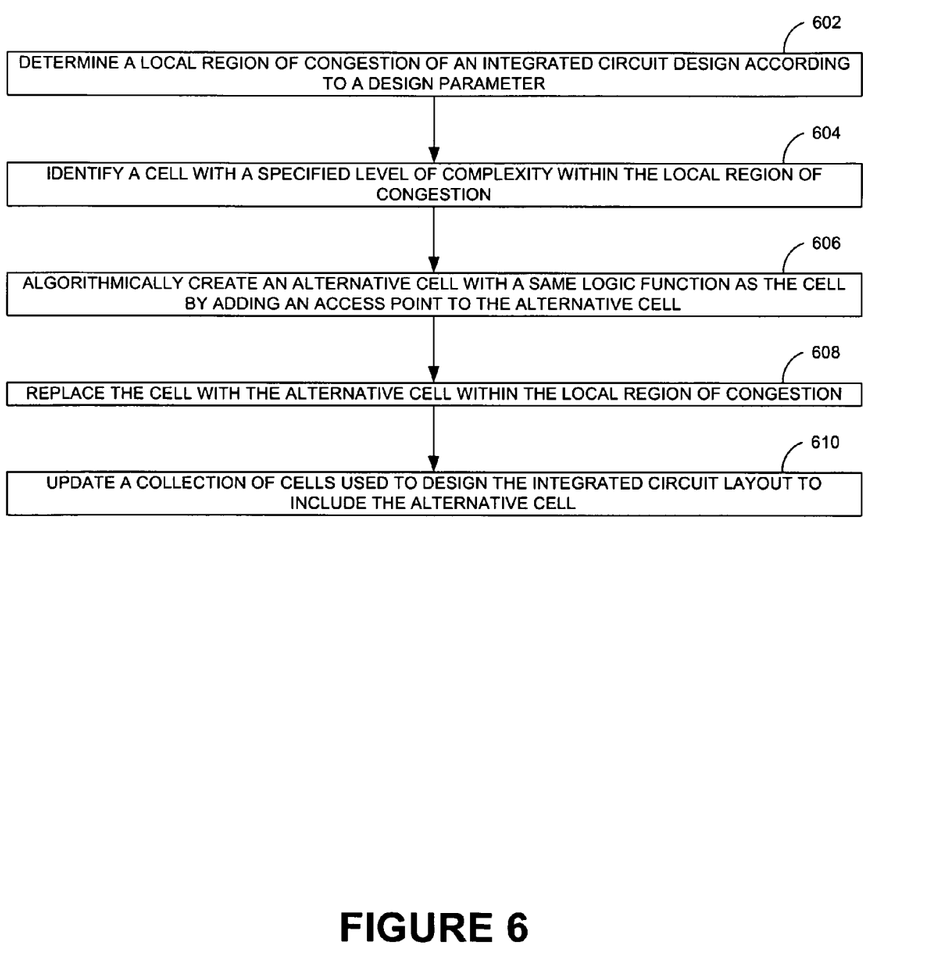
FIG. 6 is a process flow that illustrates updating a collection of cells used to design the IC layout to include the alternative cell, according to another embodiment.

FIG. 6 is a process flow that illustrates updating a collection of cells used to design the IC layout to include the alternative cell, according to one embodiment. In operation 602, a local region of congestion 212 of an IC design may be determined according to a design parameter. For example, the router module 106 may determine the local region of congestion 212. In operation 604, a cell with a specified level of complexity within the local region of congestion 212 may be identified. For example, the cell module 120 may identify the cell. In operation 606, an alternative cell may be algorithmically created with a same logic function as the cell by adding an access point 210 to the alternative cell. For example, the template module 108 may algorithmically create the alternative cell. However, another extant cell in the library of cells database 126 may be used as well in operation 606. In operation 608, the cell with the alternative cell may be replaced within the local region of congestion 212. For example, the placement module 112 may replace the cell with the alternative cell. In operation 610, a collection of cells used to design the IC layout may be updated to include the alternative cell. For example, the modified cell library module 118 may update the collection of cells.

Figure 7:
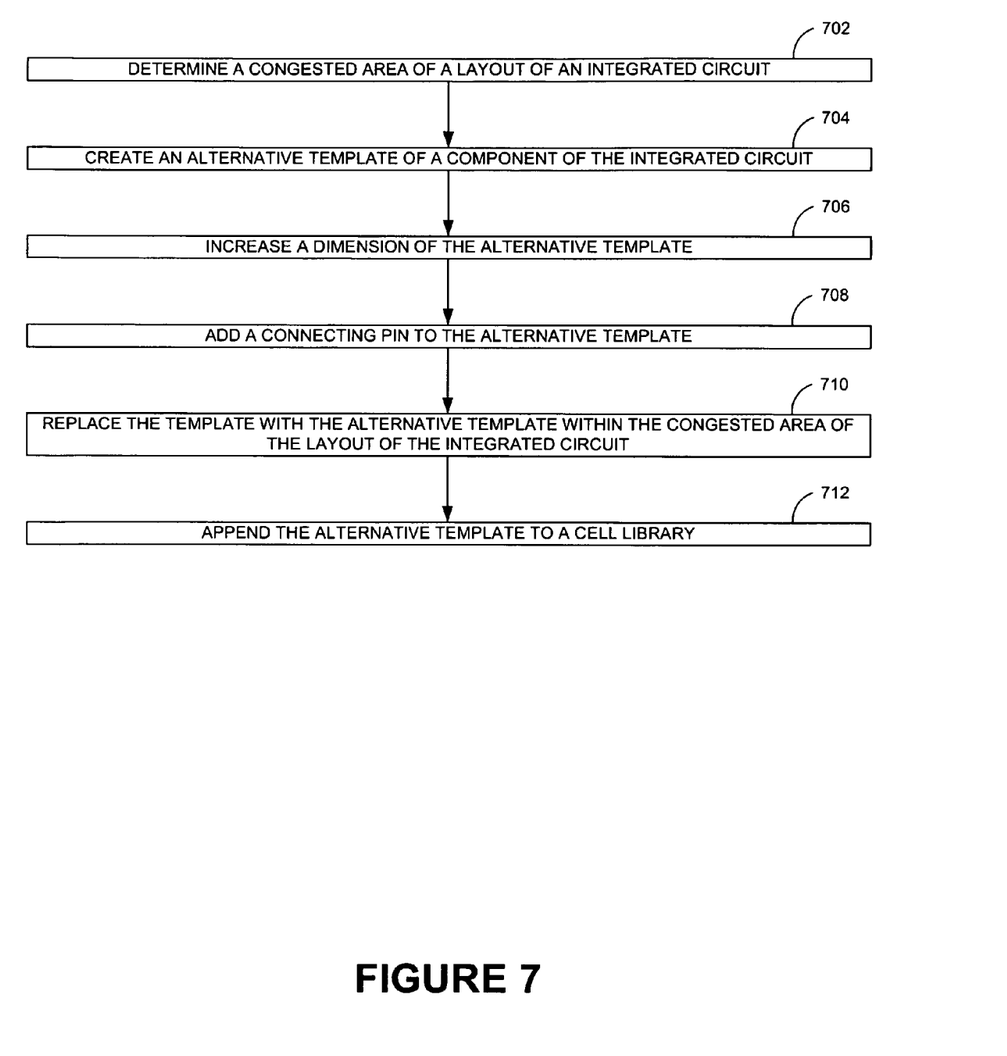
FIG. 7 is a process flow that illustrates appending an alternative template to a cell library, according to yet another embodiment.

FIG. 7 is a process flow that illustrates appending an alternative template to a cell library, according to one embodiment. In operation 702 a congested area of a layout of an IC may be determined as illustrated in FIG. 2. In operation 704, an alternative template of a component of the IC may be created. In operation 706, a dimension of the alternative template may be increased. In operation 708, a connecting pin to the alternative template may be added. Operations 702, 704 and 706 are illustrated in FIGS. 3 and 4. In operation 710, the template may be replaced with the alternative template within the congested area of the layout of the IC as illustrated in FIG. 5. In operation 712, the alternative template may be appended to a cell library. For example, the modified cell library module 118 may append the alternative template to the cell library.

Although the present embodiments have been described with reference to specific example embodiments, it will be evident that various modifications and changes may be made to these embodiments without departing from the broader spirit and scope of the various embodiments. For example, the various devices, modules, analyzers, generators, etc. described herein may be enabled and operated using hardware circuitry, firmware, software or any combination of hardware, firmware, or software embodied in a machine readable medium. For example, the various electrical structure and methods may be embodied using transistors, logic gates, application specific integrated (ASIC) circuitry or Digital Signal Processor (DSP) circuitry.

In addition, it will be appreciated that the various operations, processes, and methods disclosed herein may be embodied in a machine-readable medium or a machine accessible medium compatible with a data processing system, and may be performed in any order. Accordingly, the Specification and Drawings are to be regarded in an illustrative rather than a restrictive sense.

What is claimed is:

1. A computer utilized in accomplishing in one or more steps in a method of designing an integrated circuit, comprising:
   determining a local region of congestion of an integrated circuit design according to a design parameter;
   identifying a cell with a specified level of complexity within the local region of congestion;
   creating, algorithmically, an alternative cell with a same logic function as the cell by adding an access point to the alternative cell; and
   replacing the cell with the alternative cell within the local region of congestion, which designs the integrated circuit.

2. The computer of claim 1, wherein creating, algorithmically, an alternative cell comprises:
   increasing a dimension of the alternative cell to add the access point to the alternative cell.

3. The computer of claim 2 further comprising:
   updating a collection of cells used in an integrated circuit design layout to comprise the alternative cell.

4. The computer of claim 3, wherein the determining a local region of congestion comprises:
   determining the local region of congestion after at least one of a global routing operation, a first-pass routing operation, and a final routing operation.

5. The computer of claim 4, wherein the cell is a Boolean logic cell.

6. The computer of claim 5, wherein the determining a local region of congestion comprises:
   implementing a design rule checking operation.

7. The computer of claim 6, wherein the implementing a design rule checking operation comprises:
   Verifying an accuracy of a mask set that defines a geometry for photolithography steps of a semiconductor fabrication operation.

8. The computer of claim 1, wherein a machine is caused to perform the method of claim 1 when a set of instructions in a form of a non-transitory machine-readable medium is executed by the machine.

9. A system for designing an integrated circuit comprising:
   a router module to determine a local region of congestion of an integrated circuit design according to a design parameter;
   a cell module to identify a cell with a specified level of complexity in the local region of congestion;
   a template module to algorithmically create an alternative cell with a same logic function as the cell by adding an access point to the alternative cell; and
   a placement module to replace the cell with the alternative cell within the local region of congestion.

10. The system of claim 9, wherein the template module increases a dimension of the alternative cell in order to allow for an addition of the access point to the alternative cell.

11. The system of claim 10 further comprising a modified cell library module to store the alternative cell into a collection of cells used in the integrated circuit design.

12. The system of claim 11, wherein the router module determines the local region of congestion after at least one of a global routing operation, a first-pass routing operation and a final routing operation.

13. The system of claim 12, wherein the cell performs a logical operation with at least one logic input and produces a single logic output according to a specified Boolean operation.

14. The system of claim 13, further comprising:
a design rules module to implement a design rule checking operation that verifies a correctness of a mask set that defines a geometry for the photolithography steps of a semiconductor fabrication operation.

15. The system of claim 14, wherein the router module determines the local region of congestion with a final routing operation.

16. The system of claim 15 further comprising:
a drive module to set an other value of a drive strength level of the alternative cell to be substantially similar to a value of a drive strength level of the cell.

17. The system of claim 16, wherein the local region of congestion comprises a specified number of violations of the design parameter.

18. A computer utilized in accomplishing in one or more steps in a method of designing an integrated circuit using software comprising:
determining a congested area of a layout of the integrated circuit;
creating an alternative template of a component of the integrated circuit;
increasing a dimension of the alternative template;
adding a connecting pin to the alternative template; and
replacing a template with the alternative template within the congested area of the layout of the integrated circuit, which designs the integrated circuit.

19. The method of claim 18, wherein the determining a congested area comprises:
identifying a threshold number of violations of a specified design rule.

20. The method of claim 19 further comprising:
appending the alternative template to a cell library.

* * * * *